(12) United States Patent
Bonvalot et al.

(10) Patent No.: US 6,576,991 B1
(45) Date of Patent: Jun. 10, 2003

(54) DEVICE WITH INTEGRATED CIRCUIT PROTECTED AGAINST ATTACKS MADE BY THE CONTROLLED DESTRUCTION OF AN ADDITIONAL LAYER

(75) Inventors: Béatrice Bonvalot, Bures sur Yvette (FR); Robert Leydier, Orsay (FR)

(73) Assignee: Schlumberger Systems, Montrouge (FR)

( * ) Notice: Subject to any disclaimer, the term of this patent is extended or adjusted under 35 U.S.C. 154(b) by 0 days.

(21) Appl. No.: 09/959,166

(22) PCT Filed: Apr. 19, 2000

(86) PCT No.: PCT/FR00/01031

§ 371 (c)(1),
(2), (4) Date: Jan. 28, 2002

(87) PCT Pub. No.: WO00/63836

PCT Pub. Date: Oct. 26, 2000

(30) Foreign Application Priority Data

Apr. 19, 1999 (FR) .............................. 99 04916

(51) Int. Cl.[7] .............................................. H01L 23/02
(52) U.S. Cl. ........................ 257/680; 257/679; 257/681
(58) Field of Search ........................ 257/276, 679–681, 257/683, 659, 758, 774; 438/116; 361/737, 736, 761

(56) References Cited

U.S. PATENT DOCUMENTS

| 5,585,669 | A | * | 12/1996 | Venambre | 257/679 |
|---|---|---|---|---|---|
| 5,682,296 | A | | 10/1997 | Horejs, Jr. et al. | 361/737 |
| 5,825,080 | A | * | 10/1998 | Imaoka et al. | 257/659 |
| 5,877,547 | A | * | 3/1999 | Rhelimi | 257/679 |
| 6,058,017 | A | * | 5/2000 | Horejs, Jr. et al. | 361/737 |
| 6,140,707 | A | * | 10/2000 | Plepys et al. | 257/778 |
| 6,159,767 | A | * | 12/2000 | Eichelberger | 438/107 |
| 6,200,829 | B1 | * | 3/2001 | Miller et al. | 438/106 |
| 6,300,676 | B1 | * | 10/2001 | Kawai | 257/678 |
| 6,326,698 | B1 | * | 12/2001 | Akram | 257/781 |

FOREIGN PATENT DOCUMENTS

| DE | 197 41 889 A1 | 4/1999 |
|---|---|---|
| EP | 0 080 233 A1 | 6/1983 |

* cited by examiner

Primary Examiner—Steven Leke
Assistant Examiner—Quang Vu
(74) Attorney, Agent, or Firm—Rosenthal & Osha L.L.P.

(57) ABSTRACT

An integrated circuit device is disclosed. The device includes an active film having a semiconducting material and an integrated circuit disposed on an active face of the active film. The integrated circuit includes a plurality of circuit elements. In addition, the device includes an additional film fixed to the active face of the active film, the additional film at least partially covering said integrated circuit, and an anti-fraud mechanism disposed within the additional film, the anti-fraud mechanism being positioned to align with one of the plurality of circuit elements. In some aspects, the additional film includes a protective sub-film and a sealing sub-film, wherein the protective sub-film is sealed to the active face of the active film by the sealing sub-film.

16 Claims, 3 Drawing Sheets

DEVICE WITH INTEGRATED CIRCUIT PROTECTED AGAINST ATTACKS MADE BY THE CONTROLLED DESTRUCTION OF AN ADDITIONAL LAYER

FIELD OF THE INVENTION

The present invention concerns integrated circuit devices comprising an active layer and an additional layer fixed to one active face of said active layer. The present invention further concerns cards provided with these devices, sections of a semiconducting material provided with a plurality of these devices, as well as methods for producing these devices.

BACKGROUND OF THE INVENTION

The above-mentioned integrated circuit devices are specifically described in the international applications published under the numbers WO-96/16378, WO-97/11442 and WO-99/12204. Other devices are described in the patent applications filed in France under the numbers FR-98/081305, FR-98/13029 and FR-99/00858 which have not been made available to the public on the date of priority of the present application.

These devices are intended to process or store confidential data so as to carrying out, for example, electronic transactions in the various fields, such as those concerning health, pre-paid television, telephone applications or banking.

To this effect, the devices include volatile and non-volatile memories of the ROM, RAM, EEPROM, Flash PROM or Ferromagnetic RAM type, as well as a central processing unit or CPU, which manages and distributes said confidential data by means of address and data buses.

In practice, the devices are integrated inside an electronic module and mounted inside a card body as defined in the standards ISO 7816 and 14443 or GSM 11.11 and 11.14. Moreover, contact blocks of the devices are connected to contact areas flush with the surface of the card body, or else to the contact terminals of an antenna embedded in the card body, which enables the cards to communicate with the outside world. Depending on their mode of operation, the cards are known as contact, non-contact or mixed cards.

By means of the devices of the invention, the protection of data stored or processed in the cards is improved. In fact, physical attacks tending to disassociate the additional layer and the active layer to obtain a non-destructive access to the integrated circuit are no longer possible. The same applies for certain embodiments of said devices concerning attacks known as attacks in light in which a focussed electromagnetic radiation disturbs the protective functioning of the chip.

However, other attacks may be used with some success against known devices. These are physical attacks carried out by the controlled destruction of the additional layer and in particular attacks by polishing or etching said layer. Owing to these attacks, fraudulent persons could. access the active face of an integrated circuit device without damaging said circuit, and then learn about the architecture of the circuit and possibly implement the previously prohibited attacks, such as attacks in light, so as to access the confidential data.

In the case of attacks by polishing, a rotating polishing plate is brought parallel to the plane of the additional layer. This plate erodes this layer in a controlled way until the level of the active face is reached.

In attacks by etching, various known methods can be implemented. This is in particular the case with the RIE method (Reactive Ion Etching) which is carried out by a dry process. According to this method, reactive chemical compound preparations are created inside an electrically neutral plasma then absorbed on the surface of the additional layer of a device where they form a molecular layer of chemical complexes. Ions highly accelerated in an electrostatic field are then directed perpendicular to the additional layer of the device and destroy the molecular chemical complex layer. The additional layer, or more specifically a portion of this layer, not including the openings intended to allow an electric connection to the contact blocks, is thus finally destroyed layer by layer up to the level of the active face.

SUMMARY OF THE INVENTION

Having regard to the foregoing, the invention seeks to resolve one particular problem, namely to protect the integrated circuit devices comprising one active layer including a semiconducting material, a circuit integrated with one active face of said active layer, said integrated circuit comprising circuit elements and at least one contact block flush with said active face, and an additional layer fixed to said active face, said additional layer covering at least partially said integrated circuit of said active face against attacks via a controlled destruction of said additional face.

With regard to the above-mentioned problem, the solution of the invention aims to provide a device characterised in that a hole is provided in the additional layer, said hole being situated plumb with at least one circuit element.

Thus, destruction of the additional layer can no longer be controlled and the circuit element situated plumb with the hole is destroyed.

In addition, the object of the invention is also to produce a card body equipped with a device conforming to the invention, a section of a semiconducting material fitted with a plurality of devices according to the invention, as well as a method for producing said device.

The following description, which is in no way restrictive, shall make it possible to understand how the invention can be put into practice. This description is given with reference to the accompanying drawings on which:

DETAILED DESCRIPTION

Figure 1:
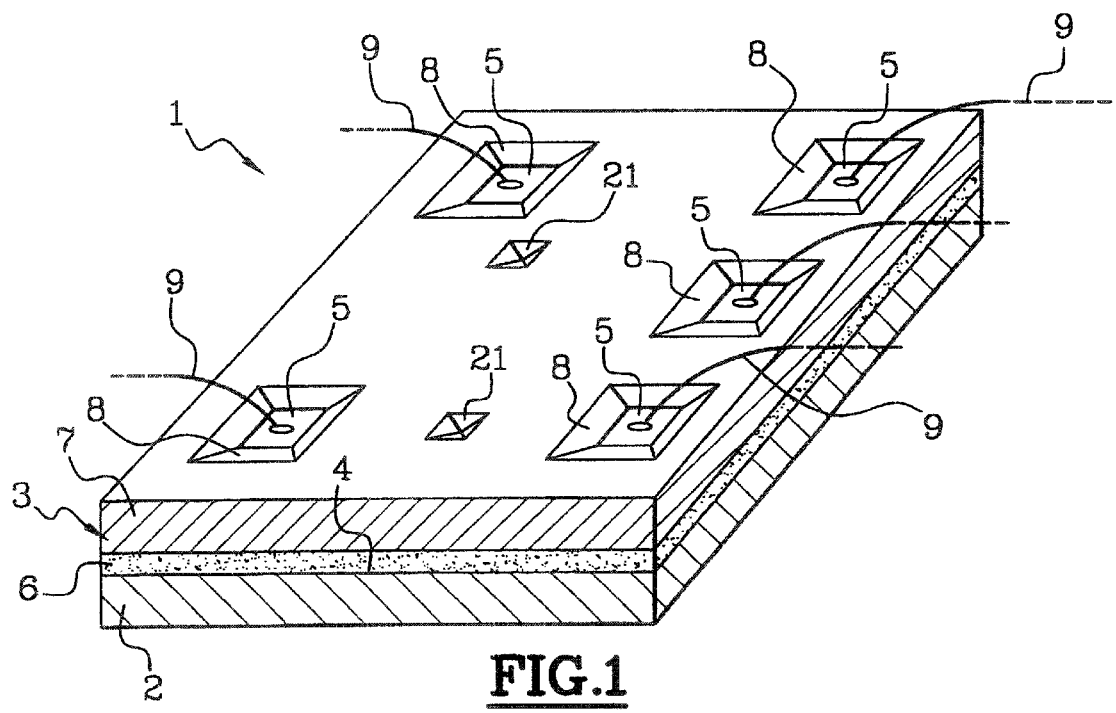
FIG. 1 shows a perspective view of a device conforming to the invention whose connection blocks are connected to conducting wires.

As shown on FIG. 1, an integrated circuit device 1 conforming to the invention comprises an active layer 2 and an additional layer 3, said layers 2 and 3 being superimposed. Said device 1 is approximately a parallelepiped and rectangle with a thickness of about 200 μm and a side dimension of 2 mm.

The active layer 2 is advantageously thinned and has an approximately constant thickness of between 10 and 80 μm, for example about 50 μm. It comprises a base sub-layer formed of a semiconducting material, particularly silicon, and an active sub-layer integrated with a circuit. The surface of the active sub-layer constitutes the active face 4 of the device. This active face 4 shows contact blocks 5, for example five in number. It also shows various circuit elements and in particular volatile and non-volatile RAM, ROM, EEPROM, Flash PROM or ferromagnetic RAM memories, a central processing unit CPU, as well as address and data bus lines. As regards the present invention, the contact blocks 5 are not circuit elements.

The additional layer 3 has an approximately constant thickness of about 150 μm. It is comprised of a sealing sub-layer 6 and a protective sub-layer 7.

The sealing sub-layer 6 is formed of an insulating material, for example a polyimide, for sealing the protective sub-layer 7 onto the active face 4 of the active layer 2. The thickness of this sub-layer 6 is approximately constant and about 10 μm.

The protective sub-layer 7 is formed of a semiconducting material, for example a monocrystalline silicon, and possibly comprises active elements, such as a capacitor, or passive elements, such as chemical particles used to prevent attacks in light, regardless of the wavelength used. The thickness of this sub-layer 7 is approximately constant and about 140 μm.

Moreover, the additional layer 3 is pierced with openings 8 opening plumb with contact blocks 5. These openings 8 are used to allow the electrical connection of the blocks 5 to antenna terminals and/or to contact areas of an electronic device and in particular a microchip card intended to receive the device. FIG. 1 shows the connection means by wires 9.

According to the invention, the additional layer 3 further comprises one or several holes 20, 21, 22, 23. These holes are plumb with one or several circuit elements. They are advantageously non-opening in the sense that they do not constitute traversing openings in the additional layer 3. Because of this, a fraudulent person cannot carry out an attack in light directed onto the circuit elements plumb with the hole. In certain embodiments methods of the invention, the non-opening holes are dummy holes in the sense that open onto one of the faces of the additional layer. In other embodiments of the invention, the non-opening holes are not dummy holes and thus form a cavity in the additional layer 3. The configuration of the holes can be any, for example cylindrical, with a rectangular or square section or conical with a rectangular or square section and possibly with a truncated base. Their section at the level of the top face of the additional layer 3 defines an area of about 100 μm2 and their depth is greater than or equal to the thickness of the sealing layer 6, that is greater than or equal to a value of 10 μm.

FIGS. 2 to 8 show various embodiments of a device conforming to the invention in which for reasons of simplicity for visualising the holes the active 2 and additional 3 [films] layers are severed.

Figure 2:
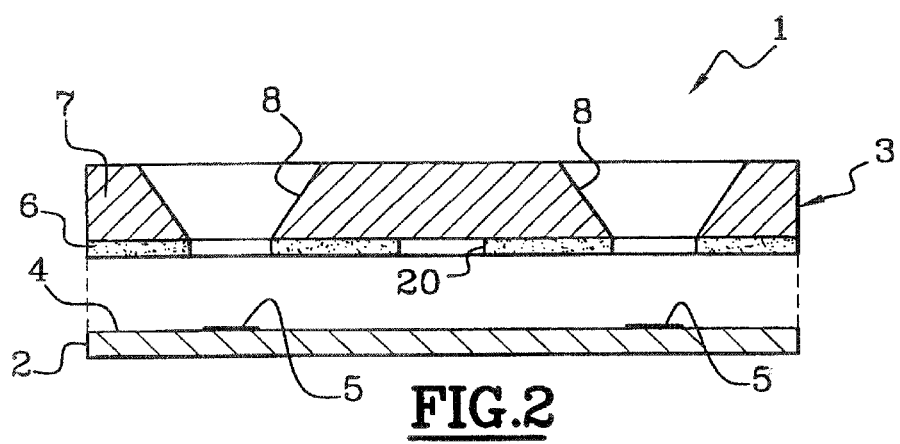
FIG. 2 shows an exploded cross sectional view of a first embodiment variant of a device according to the invention.

In the embodiment of FIG. 2, a straight cylindrical hole 20 is fitted in the sealing sub-layer 6. This hole 20 is non-opening and dummy in the additional layer 3. However, it traverses the sealing sub-layer 6 and is associated on the active face 4 of the active layer 2.

Figure 3:
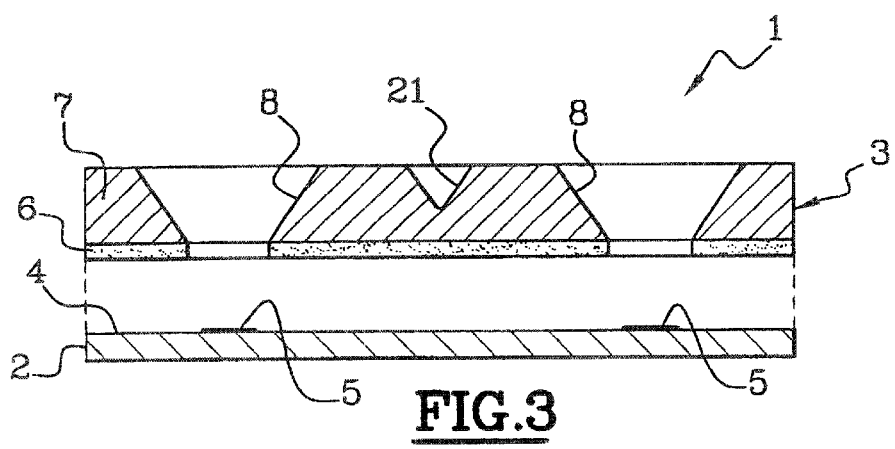
FIG. 3 shows an exploded cross sectional view of a second embodiment variant of device according to the invention.

In the embodiment of FIG. 3, a pyramidal hole 21 is fitted in the protective sub-layer 7. This hole 21 is non-opening and dummy in said sub-layer 7 and a fortiori in the additional layer 3. It opens on the face of the additional layer 3 opposite the active face 4 of the active layer 2.

Figure 4:
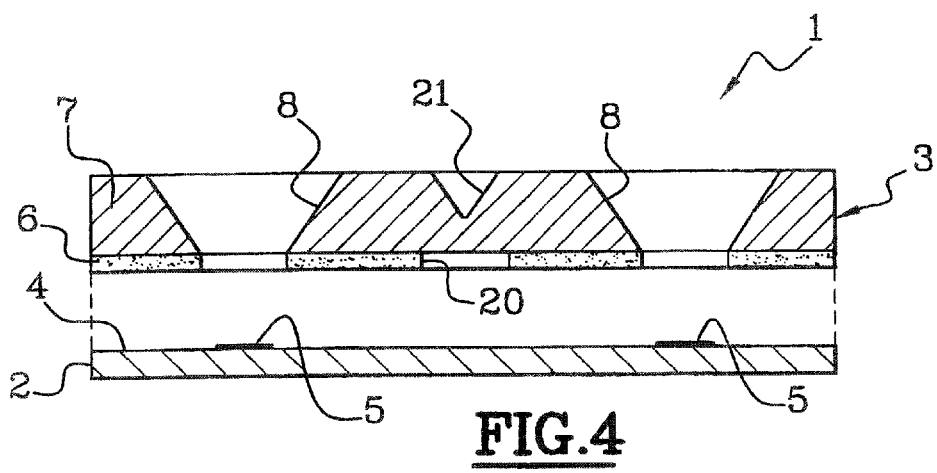
FIG. 4 shows an exploded cross sectional view of a third embodiment variant of a device according to the invention.

In the embodiment of FIG. 4, a hole 21 of the type shown on FIG. 3 is fitted in the protective sub-layer 7. This hole 21 is situated plumb with a hole 20 similar to the one shown on FIG. 2 and in correspondence with said hole 21.

Figure 5:
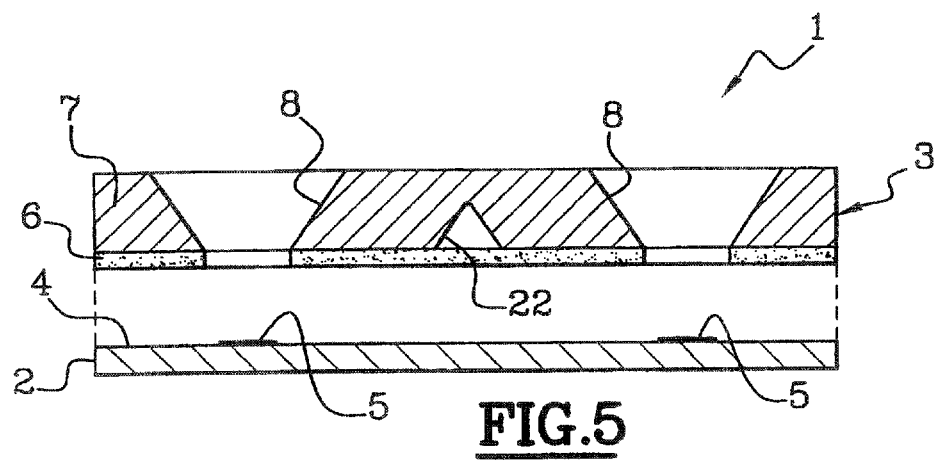
FIG. 5 shows an exploded cross sectional view of a fourth embodiment variant of a device of the invention.

In the embodiment of FIG. 5, a pyramidal hole 22 is fitted in the protective sub-layer 7. This hole 22 is non-opening and forms a cavity in the additional layer 3. This cavity is formed in the protective layer 7. It is limited by the sealing sub-layer 6.

Figure 6:
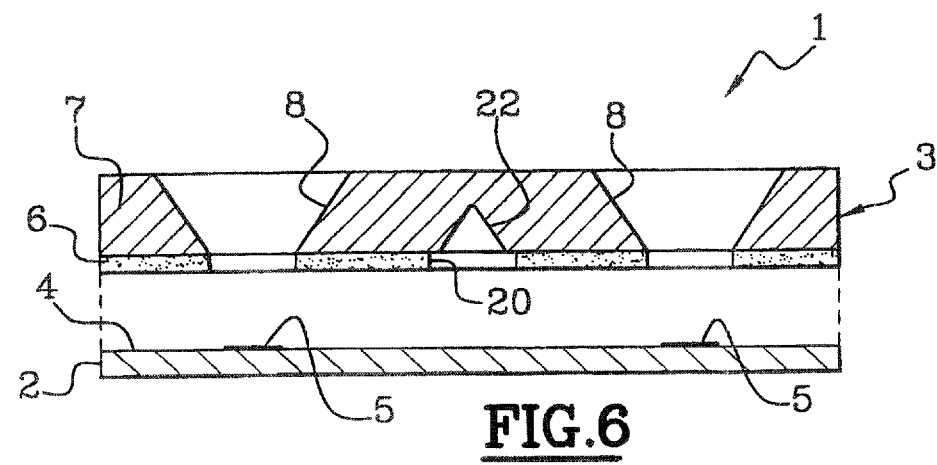
FIG. 6 shows an exploded cross sectional view of a fifth embodiment variant of a device of the invention.

In the embodiment shown on FIG. 6, a hole 22 similar to the one shown on FIG. 5 is situated plumb and in correspondence with a hole 20 fitted in the sealing sub-layer 6 and similar to the hole shown on FIG. 2. All the holes 20, 22 form a dummy non-opening hole in the additional layer 3.

Figure 7:
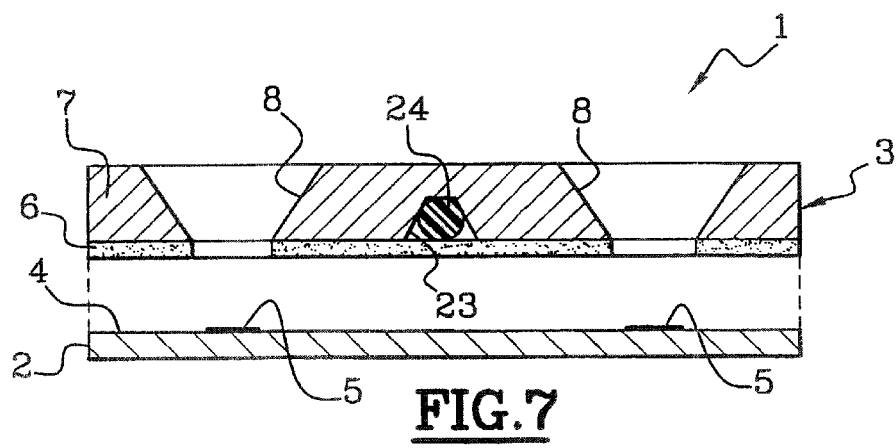
FIG. 7 shows an exploded cross sectional view of a sixth embodiment variant of a device according to the invention.

In the embodiment of FIG. 7, a non-opening hole 23 is fitted in the additional sub-layer 7. This hole 23 is conical and is truncated at its base. It defines a cavity housing a particle 24 with a hardness advantageously greater than or equal to the hardness of the active sub-layer of the active layer 2. This particle 24 may be a spherical micro-ball whose dimensions are adjusted so that the walls of the hole 23 block said particle 24.

Figure 8:
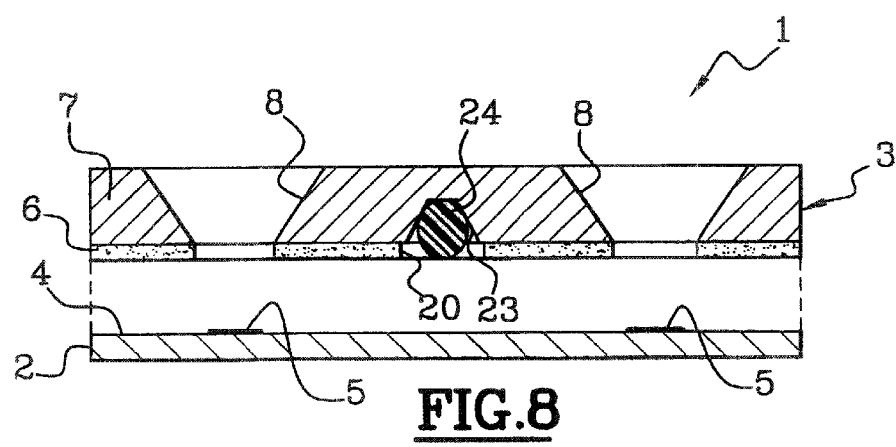
FIG. 8 shows an exploded cross sectional view of a seventh embodiment variant of a device according to the invention.

In the embodiment of FIG. 8, a hole 23 of the type shown on FIG. 7 is situated plumb and in correspondence with a hole 20 similar to the one shown on FIG. 2. The set of holes 20 and 23 forms a non-opening dummy hole in the additional layer 3 whose opening opens on the active face of the active layer 2. In this case, the particle 24 advantageously more voluminous than the particle 24 shown on FIG. 7. In fact, in the embodiment shown on FIG. 8, the particle 24 in this instance is directly in contact with the circuit element above which it projects.

Thus, should a fraudulent person try for example to access the integrated circuit of a device conforming to the invention and of the type shown on FIG. 2 by means of a RIE attack, the circuit elements situated plumb with the hole 20 would be destroyed. In fact, the RIE attack proceeds molecular layer by molecular layer and parallel to a plane, namely the plane of the additional layer 3. Also, when the level of the sealing sub-layer 6 is reached, chemical complexes are formed at the level of the hole 20 with the circuit elements. These complexes are also destroyed by ionic bombardment without a fraudulent person being able to stop this destruction. Finally, it is not possible to obtain secrets kept in the circuit.

However, it shall be noted that, when a device 1 conforming to the invention is fitted with holes of the type 20, 22 or 23, that is non-visible on the surface of the additional layer 3, the fraudulent person does not initially know if the device comprises a hole and where it is situated and thus unable to avoid the circuit elements being destroyed.

On the other hand, it shall be noted that, should the hole comprise a particle similar to the particle 24 and should the fraudulent person start polishing, the polishing rotating plate pushes the micro-particle back against the active face and this micro-particle, whose hardness is greater than or equal to that of the active sub-layer, destroys the circuit element above which it projects, namely the active layer 2 rendering the circuit unusable for obtaining the secrets it contains.

Moreover, so as to produce devices 1 conforming to the invention, sections of semi-conducting material know as wafers are used.

Figure 9:
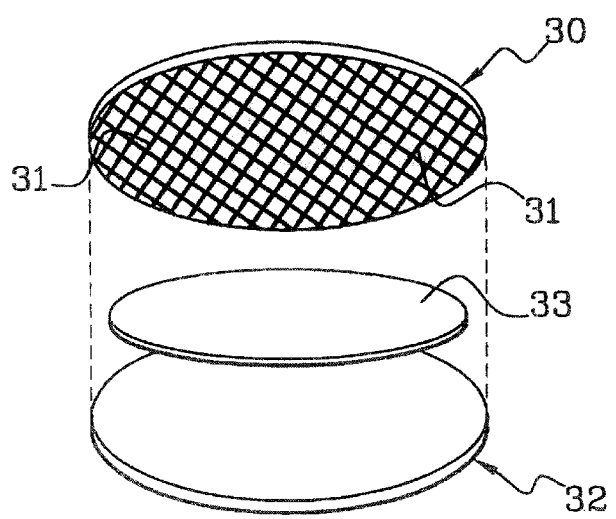
FIG. 9 shows a perspective view of the production of a semiconductor wafer fitted with a plurality of devices according to the invention.

The top portion of FIG. 9 shows a conventional wafer 30 equipped with a several hundreds or indeed thousands of integrated circuits 31. The lower portion of said figure shows a silicon section 32. This silicon section 32 is intended to be sealed to the wafer 30 by a polyimide thickness represented in the form of an intermediate section 33 between the wafer 30 and the section 32.

In practice, the section 32 is etched with a large number of non-opening openings not visible on the drawings for forming the openings 8 of the devices 1 and non-opening holes conforming to the invention.

On the other hand, a polyimide precursor thickness in a non-polymerized form is applied to the surface of the integrated circuits 31 of the conventional wafer 30 previously coated with an adherence promoter. The wafer 30 and the superimposed polyimide precursor thickness 33 are heated to a temperature of about 80° C. so that the polyimide precursor adheres sufficiently to the wafer. Holes similar to said holes 20, as well as openings permitting an electrical connection of the blocks are then fitted by etching in the precursor thickness 33.

It then suffices to mount said wafer and said polyimide precursor thickness on the section 32 and subject these new elements to pressure and temperature cycles so that the polyimide is polymerised with sealing of these elements so as to obtain a semiconducting material fitted with a plurality of devices 1 conforming to the invention.

In the case where particles 24 are added in the holes 23, said particles 24 are for example deposited on the section 32 kept approximately horizontal. These particles then fall by gravity into the holes 23. The set formed by the conventional wafer and the precursor is then vertically mounted on the section 32 in the way shown on FIG. 9.

Once sealed, the set is thinned by micro-machining and the devices 1 of the invention are cut and successively detached and mounted inside a known type of module of the prior art, this module being inserted into a card body so as to obtain a protected microchip card conforming to the invention or a portable object of the microchip card type.

It shall be noted that the holes are advantageously placed at locations differing from one integrated circuit to another of a given semiconducting section and are advantageously large in number and of different types so that a fraudulent person cannot know in advance their number and localisation.

What is claimed:

1. An integrated circuit device, comprising:
    an active layer including:
        a semiconducting material, and
        an integrated circuit disposed on an active face of the active layer, said integrated circuit comprising a plurality of circuit elements;
    an additional layer fixed to the active face of the active layer, said additional layer at least partially covering said integrated circuit; and
    an anti-fraud mechanism disposed within said additional layer, said anti-fraud mechanism being positioned to align with one of said plurality of circuit elements.

2. The integrated circuit device of claim 1, wherein the additional layer comprises a protective sub-layer and a sealing sub-layer, wherein the protective sub-layer is sealed to the active face of the active layer by the sealing sub-layer.

3. The integrated circuit device of claim 1, wherein said anti-fraud mechanism comprises a hole in the additional layer that does not completely traverse the additional layer.

4. The integrated circuit device of claim 2, wherein said anti-fraud mechanism comprises a hole in the sealing sub-layer.

5. The integrated circuit device of claim 4, wherein said anti-fraud mechanism further comprises a cavity in the protective sub-layer.

6. The integrated circuit device of claim 2, wherein said anti-fraud mechanism comprises a cavity in the protective sub-layer.

7. The integrated circuit device of claim 6, wherein said cavity opens toward the sealing sub-layer.

8. The integrated circuit device of claim 2, wherein said anti-fraud mechanism comprises a hole in the protective sub-layer.

9. The integrated circuit device of claim 8, wherein said hole does not completely traverse the protective sub-layer, and wherein said hole opens away from the sealing sub-layer.

10. The integrated circuit device of claim 6, wherein said cavity is pyramidal.

11. The integrated circuit device of claim 8, wherein said hole is pyramidal.

12. The integrated circuit device of claim 6, wherein said anti-fraud mechanism further comprises a particle disposed within the cavity.

13. The integrated circuit device of claim 12, wherein said anti-fraud mechanism further comprises a hole in the sealing sub-layer.

14. The integrated circuit device of claim 12, wherein a hardness of the particle is at least as great as a hardness of the active layer.

15. A microchip comprising a body, wherein the body is fitted with an integrated circuit device, comprising:
    an active layer including:
        a semiconducting material, and
        an integrated circuit disposed on an active face of the active layer, said integrated circuit comprising a plurality of circuit elements;
    an additional layer fixed to the active face of the active layer, said additional layer at least partially covering said integrated circuit; and
    an anti-fraud mechanism disposed within said additional layer, said anti-fraud mechanism being positioned to align with one of said plurality of circuit elements.

16. An integrated circuit device, comprising:
    an active layer including:
        a semiconducting material, and
        an integrated circuit disposed on an active face of the active layer, said integrated circuit comprising a plurality of circuit elements;
    an additional layer fixed to the active face of the active layer, said additional layer at least partially covering said integrated circuit; and
    fraud prevention means disposed within said additional layer, said fraud prevention means being positioned to align with one of said plurality of circuit elements.

* * * * *

UNITED STATES PATENT AND TRADEMARK OFFICE
CERTIFICATE OF CORRECTION

PATENT NO.    : 6,576,991 B1
DATED         : June 10, 2003
INVENTOR(S)   : Beatrice Bonvalot et al.

It is certified that error appears in the above-identified patent and that said Letters Patent is hereby corrected as shown below:

<u>Title page,</u>
Item [73], Assignee, please change "Schlumberger Systems" to -- Schlumberger Systemes --.

Signed and Sealed this

Sixteenth Day of September, 2003

JAMES E. ROGAN
*Director of the United States Patent and Trademark Office*